(12) United States Patent
Brennan, III et al.

(10) Patent No.: US 6,834,134 B2
(45) Date of Patent: Dec. 21, 2004

(54) METHOD AND APPARATUS FOR GENERATING FREQUENCY MODULATED PULSES

(75) Inventors: James F. Brennan, III, Austin, TX (US); Patrick C. Chou, Fremont, CA (US); Harry L. T. Lee, Boston, MA (US); Rajeev J. Ram, Boston, MA (US); Hermann A. Haus, Lexington, MA (US); Erich P. Ippen, Belmont, MA (US)

(73) Assignee: 3M Innovative Properties Company, St. Paul, MN (US)

( * ) Notice: Subject to any disclaimer, the term of this patent is extended or adjusted under 35 U.S.C. 154(b) by 204 days.

(21) Appl. No.: 09/816,937

(22) Filed: Mar. 23, 2001

(65) Prior Publication Data

US 2001/0036332 A1 Nov. 1, 2001

Related U.S. Application Data

(60) Provisional application No. 60/195,818, filed on Apr. 11, 2000.

(51) Int. Cl.[7] .............................. G02B 6/34; G02F 1/025; H01S 3/10
(52) U.S. Cl. ................................. 385/15; 385/37; 372/25; 372/28; 372/26; 398/191; 398/199; 398/200; 359/278; 359/237
(58) Field of Search ................................. 398/191, 199, 398/200; 385/15, 37; 372/25, 26, 28, 21, 102; 359/278, 237, 238

(56) References Cited

U.S. PATENT DOCUMENTS

| 4,746,193 | A | * | 5/1988 | Heritage et al. ............ 359/559 |
| 4,928,316 | A | * | 5/1990 | Heritage et al. ............ 359/154 |
| 5,400,350 | A | * | 3/1995 | Galvanauskas ............... 372/20 |
| 5,602,677 | A |   | 2/1997 | Tournois ..................... 359/566 |
| 5,633,885 | A | * | 5/1997 | Galvanauskas et al. ....... 372/25 |
| 5,696,782 | A | * | 12/1997 | Harter et al. .................. 372/25 |
| 5,771,250 | A | * | 6/1998 | Shigehara et al. ............. 372/6 |
| 5,912,999 | A |   | 6/1999 | Brennan, III et al. ......... 385/37 |
| 6,035,083 | A |   | 3/2000 | Brennan, III et al. ......... 385/37 |
| 6,163,638 | A | * | 12/2000 | Eggleton et al. .............. 385/37 |
| 6,249,630 | B1 | * | 6/2001 | Stock et al. ................. 385/123 |

FOREIGN PATENT DOCUMENTS

WO  00/02077  1/2000  ........... G02B/6/293

OTHER PUBLICATIONS

Erdogan, Turan "Fiber Grating Spectra" Journal of Lightwave Technology, IEEE, vol. 15, No. 8, Aug. 1997, p. 1278.*

Andrekson "Digital Transmission with Intracavity Loss Modulated Quantum Well Distributed Feedback Lasers" IEEE Transactions Photonics Technology Letters, Vol. 3, No. 12, Dec., 1991, pp. 1150–1152.*

(List continued on next page.)

Primary Examiner—David V. Bruce
Assistant Examiner—Krystyna Suchecki
(74) Attorney, Agent, or Firm—Gregg J. Rosenblatt (57) ABSTRACT

A method and apparatus are provided for generating short (e.g., picosecond) pulses using a 2 section 1553 nm DBR laser without gain switching nor external modulation. The center wavelength of the DBR section is modulated at 0.5 GHz to generate a constant amplitude frequency modulated optical wave Large group velocity dispersion is then applied with a chirped fiber Bragg grating to convert the FM signal to a pulse stream.

13 Claims, 5 Drawing Sheets

OTHER PUBLICATIONS

Kjebon, et al. "30GHz direct modulation bandwidth in detuned loaded InGaAsP DBR lasers at 1.55 um wavelength" Eletronics Letters 13th Mar. 1997 vol. 33 No. 6.*

E. O. Amman et al., "*Detailed Experiments on Helium–Neon FM Lasers*", *Journal of Quantum Electronics*, vol. QE–1, No. 6, Sept. 1965, pp. 262–272.

S. R. Chinn et al., "*FM Mode–Locked $Nd_{0.5}La_{0.5}P_5O_{14}$ Laser[a)]*", *Applied Physics Letter*, vol. 34, No. 12, Jun. 15, 1979, pp. 847–849.

S. R. Chinn, et al., "*Frequency Modulation Locking in 980nm Strained Quantum Well Lasers*", *Electronics Letters*, vol. 29, No. 8, Apr. 15, 1993, pp. 646–648.

S. R. Chinn and E. A. Swanson, "*Passive FM Locking and Pulse Generation from 980–nm Strained–Quantum–Well Fabry–Perot Lasers*", *IEEE Photonics Technology Letters*, vol. 5, No. 9, Sep. 1993, pp. 969–971.

P. C. Chou et al., "*0.5 GHz Picosecond Pulse Train from a DBR Laser and Chirped Fiber Bragg Grating*", MIT, Draper Labs, and 3M Telecom Systems Paper.

S. E. Harris and R. Targ, "*FM Oscillation of the He–Ne Lasers*", *Applied Physics Letters*, vol. 5, No. 10, Nov. 15, 1964, pp. 202–204.

S. E. Harris and O. P. McDuff, "*FM Laser Oscillation—Theory[1]*", *Applied Physics Letters*, vol. 5, No. 10, Nov. 15, 1964, pp. 205–206.

O. Kjebon et al., "*30 GHz Direct Modulation Bandwidth in Detuned Loaded InGaAsP DBR Lasers at 1.55 µm Wavelength*", *Electronics Letters*, vol. 33, No. 6, Mar. 13, 1997, pp. 488–489.

D. J. Kuizenga and A. E. Siegman, "*FM–Laser Operation of the Nd:YAG Laser*". *IEEE Journal of Quantum Electronics*, vol. QE–6, No. 1, Nov. 1970, pp. 673–677.

W. K. Marshall et al., "*Laser Phase Noise to Intensity Noise Conversion by Lowest–Order Group–Velocity Dispersion in Optical Fiber: Exact Theory*", *Optics Letters*, vol. 25, No. 3, Feb. 1, 2000, pp 165–167.

R. Nagar et al., "*Frequency–modulation Mode Locking of a Semiconductor Laser*", *Optics Letters*, vol. 16, No. 22, Nov. 15, 1991, pp. 1750–1752.

Eva Peral et al., "*Precise Measurement of Semiconductor Laser Chirp Using Effect of Propagation in Dispersion Fiber and Application to Simulation of Transmission Through Fiber Gratings*", *Journal of Lightware Technology*, vol. 16, No. 10, Oct. 1998, pp. 1874–1880.

Luuk F. Tiemeijer et al., "*Passive FM Locking in InGaAsP Semiconductor Lasers*", *IEEE Journal of Quantum Electronics*, vol. 25, No. 6, Jun. 1989, pp. 1385–1392.

P. C. Chou and H. A. Haus, "*Reconfigurable Time–Domain Spectral Shaping of an Optical Pulse Stretched by a Fiber Bragg Grating*", *Optics Letters*, vol. 25, No. 8, Apr. 15, 2000. pp. 524–526.

M. McAdams, et al., "*Improved Laser Modulation Response by Frequency Modulation to Amplitude Modulation Conversion in Transmission Through a Fiber Grating*", Appl. Phys. Lett. 71 (7), Aug. 18, 1997, pp. 879–881.

* cited by examiner

METHOD AND APPARATUS FOR GENERATING FREQUENCY MODULATED PULSES

The present application is related to U.S. Ser. No. 60/195,818, filed on Apr. 11, 2000.

FIELD OF THE INVENTION

The present invention relates generally to modulation of optical carrier signals, and more particularly to the frequency modulation of such pulses.

BACKGROUND OF THE INVENTION

The spectral shaping of optical pulses has been studied extensively, and is the subject of numerous articles, patents, and patent applications. Much of this work has concerned amplitude modulation of laser pulses. U.S. Pat. No. 5,912,999 (Brennan III, et al.) is representative of this technology, as are U.S. Ser. No. 09/401,160, entitled "Method and Apparatus for Arbitrary Spectral Shaping of an Optical pulse", filed Sep. 22, 1999; U.S. Ser. No. 09/161,944, entitled "Long-Length Continuous Phase Bragg Reflectors in Optical Media", filed on Sep. 28, 1998; and U.S. Ser. No. 09/110,495, entitled "Method for Writing Arbitrary Index Perturbations on a Waveguide", filed Jul. 6, 1998.

Frequency modulation of optical pulses has also been studied to some extent. Thus, researchers have investigated both active and passive mode locking of multiple longitudinal (axial) optical modes of laser cavities. Examples of active mode locking are described in S. E. Harris, R. Targ, *Appl. Phys. Lett.*, 5, 202 (1964), E. O. Ammann, B. J. McMurtry, M. K. Oshman, *IEEE JQE*, QE-1, 263 (1965), D. J. Kuizenga, A. E. Siegman, *IEEE JQE*, QE-6, 673 (1970), and R. Nagar, D. Abraham, N. Tessler, A. Fraenkel, G. Eisenstein, E. P. Ippen, U. Koren, G. Raybon, *Opt. Lett.*, 16, 1750 (1991). Examples of passive mode locking are described in L. F. Tiemeijer, P. I Kuindersma, P. J. A. Thijs, G. L. J. Rikken, *IEEE JQE*, 25, 1385 (1989), and S. R. Chinn, E. A. Swanson, *IEEE Phot. Tech. Lett.*, 5, 969 (1993). However, there have been no reports to date of lasers exhibiting FM operation with a single longitudinal mode.

M. McAdams, E. Peral, D. Provenzano, W. Marshall, and A. Yariv, Appl. Phys. Lett. 71 (7) 879 (Aug. 18, 1997) describes a method for converting frequency modulation to amplitude modulation by transmitting the signal of a semiconductor laser through an optical isolator and into a fiber pigtail comprising various lengths of single-mode non-dispersion shifted fiber and/or an unchirped fiber grating. The reference notes that, in a directly modulated semiconductor laser, a frequency modulation or chirp inevitably accompanies modulation of the amplitude. This work tried to improve the frequency response of a modulated DF laser by frequency modulation of its output.

Some telecommunications applications of lasers require a stable, low-jitter source of ultrashort pulses at typical fiber optics telecommunications wavelengths (approximately 1300 and 1550 nm). Present methods of obtaining short pulses from semiconductor lasers at these wavelengths typically involve gain switching or mode locking. However, gain switching is often plagued by inherent instabilities that arise from the need for the laser to build up from below the lasing threshold for each pulse. Active mode locking can also be unstable because the mode locking frequency must remain tuned to the cavity resonant frequency, which can drift with temperature changes or other environmental effects.

There is thus a need in the art for a method for generating a stable, low jitter source of optical pulses suitable for use in the telecommunications industry. There is also a need in the art for a device suitable for generating such pulses.

These and other needs are met by the present invention, as hereinafter described.

SUMMARY OF THE INVENTION

In one aspect, the present invention relates to a method and device for generating frequency modified (FM) pulses. In accordance with the method, a short cavity single longitudinal mode laser is employed as a source that can be frequency modulated by rapidly tuning the distributed Bragg Reflector (DBR) section of the laser. This technique produces results similar to FM modelocked pulse sources. However, the source can be modulated at frequencies not synchronous with the cavity resonance.

In another aspect, the present invention relates to a method for generating picosecond pulses at an electronically defined repetition rate without gain switching, modelocking, nor external modulation. In accordance with the method, a 1553 nm DBR laser coupled to a chirped fiber grating is used as a pulse source. The pulse source exhibits stable operation and potentially low timing jitter.

In another aspect, the present invention relates to a picosecond optical pulse source consisting of a frequency modulated semiconductor laser with high modulation depth and a long chirped fiber Bragg grating with large group velocity dispersion. Unlike modelocked lasers, this source has a repetition rate which is not required to be synchronous with the laser cavity resonance, enabling stable operation. Because frequency modulation does not require gain switching, there is potential for very low timing jitter. The FBG also provides potential for higher pulse energies, lower background level, and more efficient use of the total laser energy output.

In yet another aspect, the present invention relates to a method for generating a pulse stream, and to the pulse stream so obtained. In accordance with the method, a sinusoidally varying current is applied to the mirror section of a 2-section distributed Bragg reflector laser, thereby modulating its lasing frequency to generate an frequency modulated optical wave. The modulation rate is arbitrary, as long as it is much lower than the cavity's fundamental resonance. At the laser output, a large group velocity dispersion is applied with a chirped fiber Bragg grating to convert the frequency modulated signal to a pulse stream. The effect of the group velocity dispersion is that the up-chirped portion of the signal is compressed into pulses while the down-chirped portion is further chirped and dispersed into the background. With sinusoidal modulation and linear dispersion, the pulses contain approximately 40% of the total energy.

DETAILED DESCRIPTION OF THE INVENTION

Figure 1:
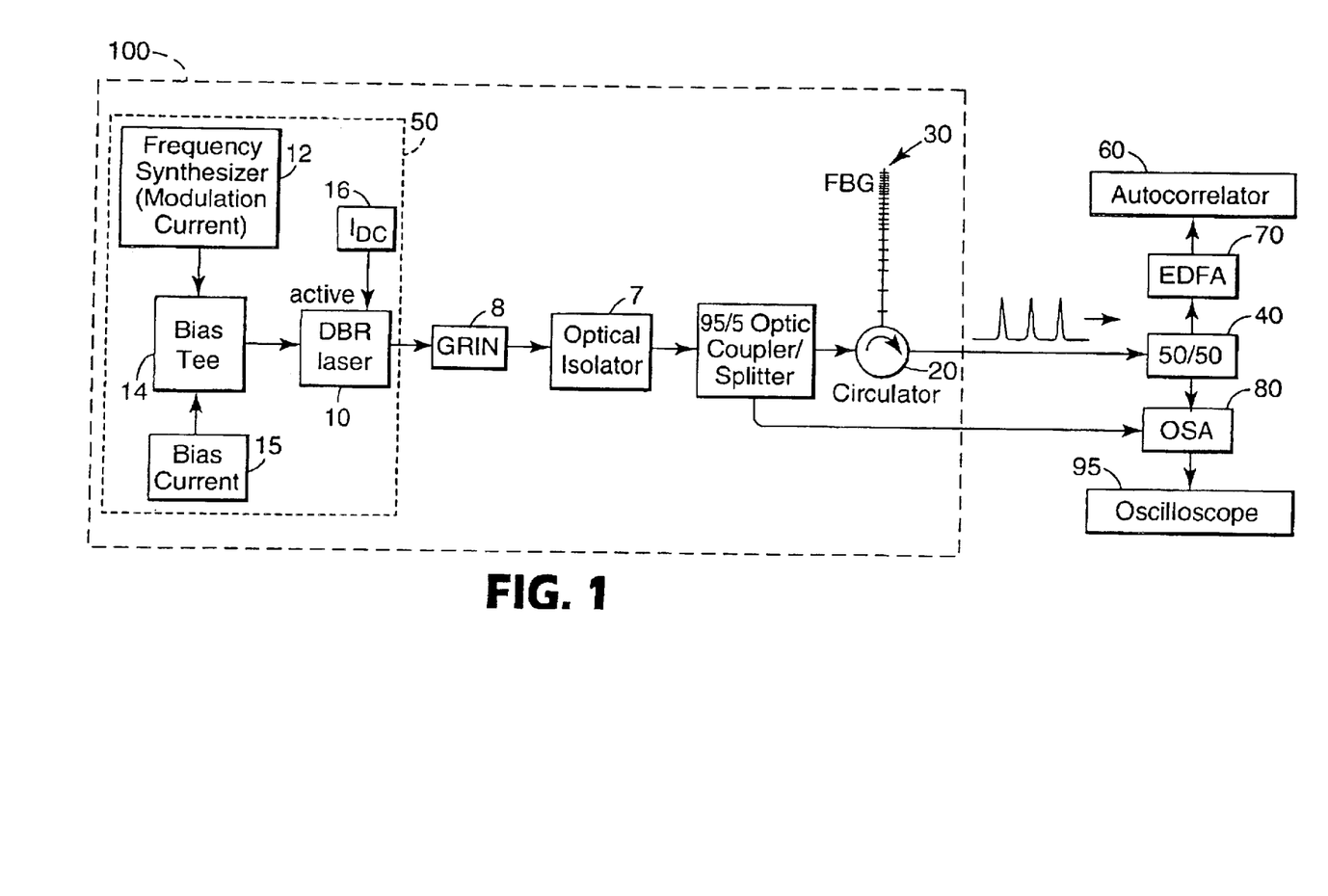
FIG. 1 is a schematic diagram of a device for generating frequency modulated pulse streams.

The devices and methodologies of the present invention may be understood with reference to FIG. 1, which illustrates schematically a preferred embodiment of a set-up suitable for generating pulse trains. The setup 100 includes a circulator 20, which directs the signal into a dispersive element such as a fiber Bragg Grating (FBG) 30. The set-up is provided with a signal source 50. This source is preferably an optical source in the form of a 2 section InGaAsP distributed Bragg reflector (DBR) laser 10. Lasers of this type are described in Kjebon, et al., "30 GHz Direct Modulation Bandwidth in Detuned Loaded InGaAsP DBR lasers at 1.55 Micrometer Wavelength", Electronics Letters, Dec. 19, 1996 (Electronic Letters Online No. 19970335). Other DBR lasers are commercially available and could be frequency modulated for use in the present invention as well, such as those available from the Altitun Corporation of Stockholm, Sweden as model number NYW-30.

The frequency modulated (FM) pulse source is comprised of a dispersive element 30, such as a chirped fiber Bragg grating (FBG), a circulator 20, and a tunable laser, such as a distributed Bragg reflector (DBR) 10 semiconductor laser diode. The injection current of the laser's DBR mirror section is modulated, causing the lasing frequency to also be modulated. The gain section of the laser is pumped by current supply 16, which supplies a DC current $I_{DC}$.

The dispersive element 30 applies group velocity dispersion (GVD) to the optical source output and converts the frequency modulation to amplitude modulation. The different instantaneous frequencies experience different temporal delays and thus bunch together. When the dispersion and modulation depth are optimized, short pulses are formed.

The advantage of this technique is in its simplicity and stability. Short pulses are formed without the use of gain switching nor amplitude modulators. Timing jitter is potentially low compared to gain switched lasers because the laser gain never drops below threshold. Pulse widths are short compared to conventional phase modulation schemes because wider optical frequency ranges can be swept with this technique. The use of the long FBG enables low repetition rate, which results in higher pulse energies and more optimized modulation signals such as a sawtooth wave.

For the device depicted in FIG. 1, the modulation response is found to roll off at around 1 GHz. The laser is controlled in such a way as to modulate the center wavelength of the DBR section to generate a constant amplitude, frequency modulated (FM) optical wave. The laser is operated with a single longitudinal mode, and is not mode locked or gain switched.

A bias current from a DC current supply 16 is applied to keep the laser above the lasing threshold at all times. Current supplies suitable for this purpose include laser diode drivers of the type available from Newport, Inc. (Irving, Calif.) as Model 5005 Laser Diode Driver. A 0.5 GHz current signal supplied by the frequency synthesizer 12 (model number HP 83712B, available from Hewlett Packard Co., Palo Alto) was applied to the mirror section of the DBR, via a bias tee 14. The current modulated the center wavelength of the DBR reflector due to carrier induced index changes. The modulation frequency is arbitrary, as long as it is much lower than the cavity's fundamental resonance. The laser gain bias was 66 mA and the mirror section bias was 11.75 mA. The minor bias current, supplied by bias source 15, and modulation current were combined in the bias tee 14 from Picosecond Pulse Labs, Boulder Colo. The resulting optical signal was frequency modulated with a modulation index of 52.5, defined as $$m = \Delta f / f m \quad (1)$$

where the total sweep range $2\Delta f$ is 50 GHz, corresponding to 0.4 nm at 1553 nm, and wherein $f_m$ is the modulation frequency 0.5 GHz. With higher modulation current, the bandwidth can be as wide as 0.76 nm, generating an index m of 95.

The constant amplitude, frequency modulated output of the DBR laser was focused by means of a graded index (GRIN) lens into a fiber pigtailed optical isolator 7 (available as model number I-15-PIPT-MU-A from isowave, Inc., Dover, N.J.) which prevented backreflections from destabilizing the laser. To monitor the output of the laser, a portion of the light exiting the isolator was split off by focussing the light into one input of a 1550 nm 95/5 single mode fiber optic coupler/splitter (Gould Fiber Optics, Millersville, Md.). The 5% output of the splitter was directed into an optical spectrum analyzer (OSA) 80 (available as model number HP 70950B from Hewlett Packard. Inc., Palo Alto, Calif.).

Figure 2:
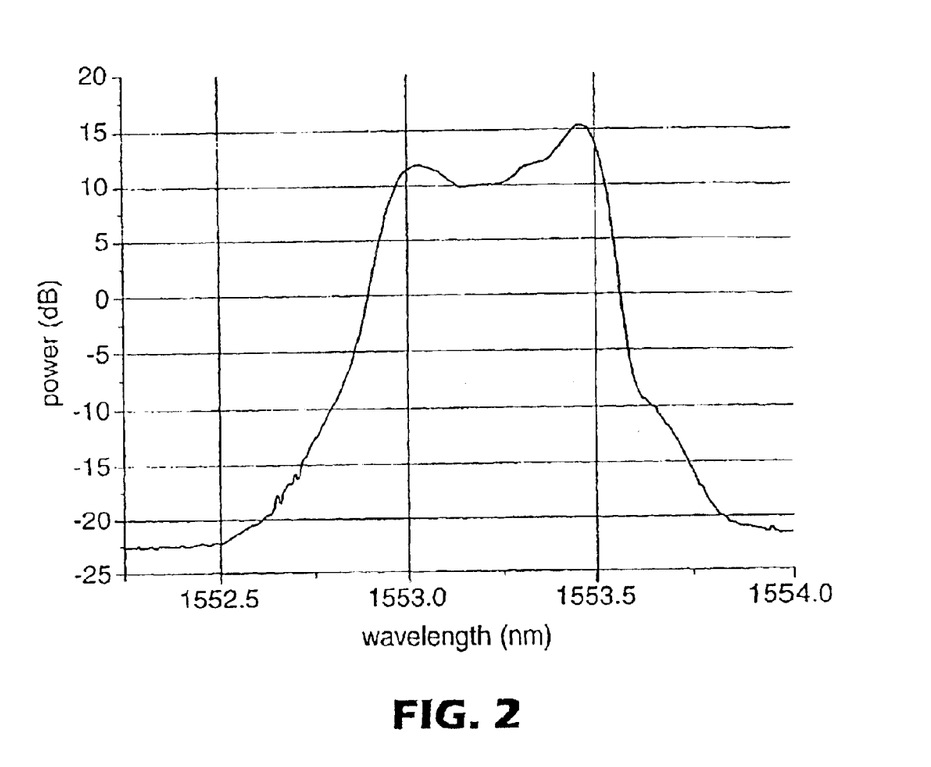
FIG. 2 is a spectrum of the output of the laser utilized in EXAMPLE 1.

A typical laser output spectrum from the Optical Spectrum Analyzer (OSA) 80 is shown in FIG. 2. The shape shows a minimum in the center, which is consistent with calculated FM spectra. However, the individual harmonics are smeared by the 0.1 nm OSA resolution. Suppressed neighboring modes were also observed next to the modulated mode. For interconnecting most of the fiber optic components and equipment in this experimental system, FC/APC or FC/PC connectors were used.

The majority of the laser light was next routed from the splitter 95% output to the input port of a packaged module containing a 3-port optical circulator 20 and a long, spatially chirped, nominal 1550 nm wavelength fiber optic Bragg grating (FBG) 30 having a dispersion of −1360.8 ps/nm. The circulator/FBG module was obtained from 3M Telecom Systems Division, Austin, Tex. The long, chirped grating was manufactured by the processes described in U.S. Pat. No. 5,912,999 (Brennan, III et al.), U.S. Pat. No. 6,035,083 (Brennan, III et al.), and in related applications. The input and output ports of the module came connectorized with SC fiber optic connectors.

The large group velocity dispersion (GVD) of the chirped grating converts the FM signal to a pulse stream. One can visualize the different instantaneous frequencies of the FM signal occurring at different times. The effect of the GVD is that the lower the optical frequency, the smaller the group delay. The lower frequencies then catch up with the higher ones, causing all frequency components to bunch together, thereby creating amplitude pulses. With sinusoidal modulation and linear dispersion, the pulses contain approximately 40% of the total energy. For a sinusoidal input current, the laser output frequency increases or "chirps up" (and the wavelength shortens) as the input current rises and the frequency decreases or "chirps down" as the input current falls. (The grating delays short wavelengths more than long wavelengths.) If the frequency modulated laser output is then passed through a highly dispersive element, such as a circulator followed by a spatially chirped Bragg grating, each "chirped up" portion of a frequency modulation cycle is compressed into a single optical pulse, and the "chirped down" portions are dissipated or lost. For a sinusoidal input to the DBR laser, this would then result in a maximum of 50% of the laser output power being converted to pulses, corresponding to the chirp up half of the cycle. This assumes that the spatial chirp of the dispersive element is "sinusoidal" and exactly matches the chirp up pattern of the laser output. In fact, presently available dispersive elements, such as long lengths of single mode optical fiber, have a linear dispersion (linear change of light speed, refractive index, or signal transit time with respect to wavelength). An element with linear dispersion will only be effective at converting the chirped up continuous signal to pulses during the "quasi-linear" portion of the sinusoidal cycle. Therefore, the efficiency of energy conversion into pulses will be even less than 50% for a sinusoidally frequency modulated laser output followed by a linearly dispersive element. The efficiency could be made to approach the theoretical 50% for sinusoidal frequency modulation if the fiber Bragg grating were designed with the appropriate spatial chirp (spatial chirp refers to the property of a non-uniform Bragg grating which allows it to reflect different wavelengths at different positions along the grating—the spatial frequency of the grating planes is chirped).

For frequencies in the GHz range, the only electronic input signal generators presently available are sinusoidal. However, for frequencies at less than about 100 MHz, function generators are available which can produce more complex and sophisticated input waveforms, including square waves and sawtooths. Driving a DBR laser with a rising sawtooth wave would create a laser output which is almost entirely chirped up, resulting in nearly 100% energy conversion to pulses in a linearly dispersive element. With a sawtooth frequency variation at 10 MHz (1 frequency rise each $10^{-7}$ sec), nearly all of the constant amplitude laser output energy emitted during one rise would be compressed into a single pulse lasting less than 50 picoseconds. This would be an increase of over 2000 in the energy delivered per unit time during the pulse, with an even greater increase in peak power density. High power densities are required for nonlinear optical process such as second harmonic generation, among other applications.

EXAMPLE 1

This example illustrates the generation of frequency modulated pulses in accordance with the present invention.

A set-up of the type depicted in FIG. 1 was used to generate light pulses. The light pulses generated from the wavelength-selective distributed reflection in the FBG were routed by the circulator to the output port of the dispersion module. The output port was connected to one input of a 1550 nm 50/50 single mode fiber optic coupler/splitter (Gould Fiber Optics, Millersville, Md.) 40, where the initial pulse train was split into two "identical" pulse trains, each of which carried approximately half the energy of the original pulse train. The pulses of one of the resulting pulse trains were characterized using an autocorrelator 60 (Femtochrome FR-103MN autocorrelator, Berkeley, Calif.). An erbium doped fiber amplifier (EDFA) 70 was required to boost the signal for making autocorrelation measurements because the optical power at the output was only 0.15 mW.

A comparable commercial EDFA is Calmar Optcom model EDFA-02 (Mountain View, Calif.).

Figure 3:
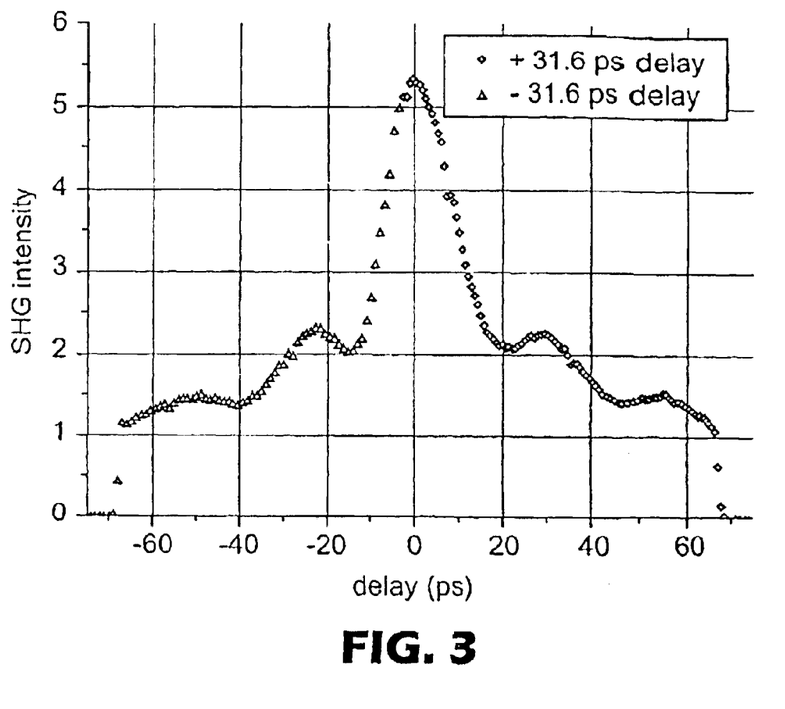
FIG. 3 is a graph of the autocorrelation of the pulse train generated by the device of EXAMPLE 1.

FIG. 3 shows an autocorrelation of the pulse, showing a ~25 picosecond full width at half maximum (FWHM). The commercial autocorrelator has a sweep range of 75 picoseconds. To increase the effective range, the trace was constructed from two separate measurements with different delay offsets.

The other pulse train emerging from the 50/50 splitter 40 was directed into the optical spectrum analyzer (OSA) 80, including a photodiode (such as those obtained from Discovery Semiconductor DSC30, Princeton, N.J.) which was connected to an oscilloscope (model number HP 54750A, obtained from Hewlett Packard, Inc., Palo Alto, Calif.) which was used for monitoring the output pulses.

Figure 4:
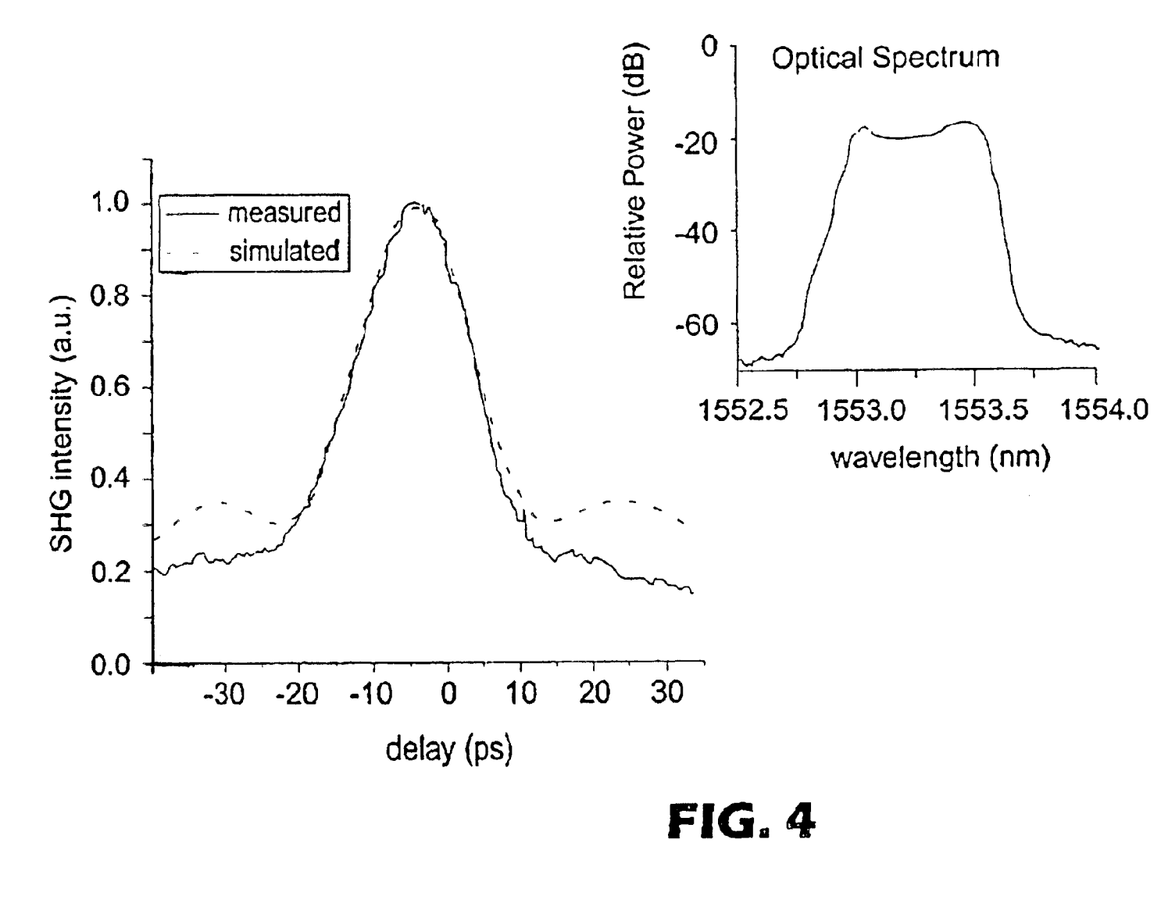
FIG. 4 is a graph of theoretical and measured autocorrelations, with the inset depicting the optical spectrum of the frequency modulated signal.
Figure 5A:
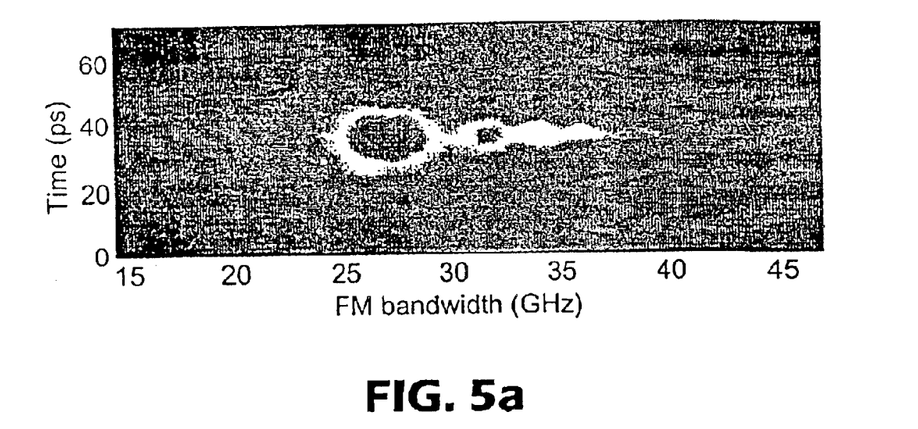
FIGS. 5a–5b are experimental and calculated autocorrelation traces, respectively, with varying bandwidth and fixed dispersion.
Figure 5B:
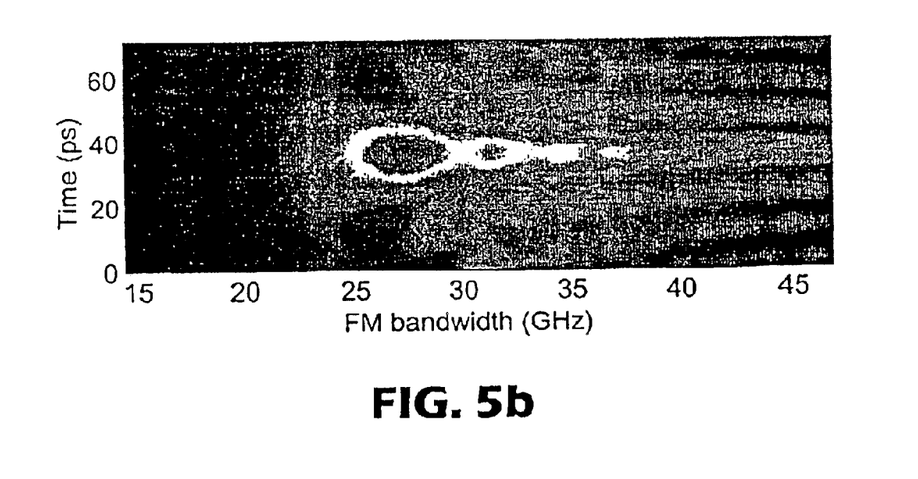

The optical spectrum of the FM signal has a peak to peak width of 0.42 nm, shown in the inset of FIG. 4, which also shows theoretical and measured autocorrelations. The suppression of the sidelobes predicted by the simulation is likely due to residual amplitude modulation. The FWHM is approximately 25 ps, roughly corresponding to a time-bandwidth product of unity. Harmonic distortion of the modulation signal is included in the simulation and can also account for a rise in background and degradation of pulse power efficiency. Given the bandwidth, FBG dispersion, and $f_m$, it is estimated that 25% of the total power is in the pulse. This is consistent with estimates based on oscilloscope measurements. FIG. 5 shows a sequence of autocorrelations as a function of bandwidth, with harmonic distortion included in both measured and simulated plots.

The shortest achievable pulse is limited by the laser free spectral range, which in this case yields an inverse bandwidth of 4.9 ps. To further reduce sidelobes and overall background, amplitude modulation in the gain section can be induced. Alternatively, a sawtooth wave FM signal can replace the sinusoidal and induce only linear up-chirping.

This would also utilize the total power more efficiently. Sawtooth wave generation is more easily accomplished at lower repetition rates, however, requiring enormous dispersion delay which is best achieved with a long FBG as used here. An FBG is also advantageous in that its high order dispersion can be designed to match residual nonlinear chirp.

This example illustrates three features of the present invention. First, the wide frequency span and high modulation index is generated in a simple manner. To generate the chirp with external phase modulation is possible, but adds complexity. See, e.g., D. S. Kim, M. Arisawa, A. Morimoto, T. Kobayashi, *IEEE J Sel. Topics in QE,* 2, 493 (1996). Second, the laser is not modelocked. Modulating a single longitudinal mode laser is more stable, eliminates restrictions on repetition rates, and can potentially provide a low jitter pulse train for use in optical sampling. Third, the long FBG technology enables the use of low repetition rates which provide the option of more optimized modulation and dispersion shape to increase efficiency and reduce background.

The devices and methodologies of the present invention have utility in a variety of end use applications, including high speed optical sampling and A/D (analog to digital) conversion. For high bandwidth signals, especially RF and microwave signals, electronic A/D converters with sufficient speed do not presently exist. Therefore, it is desirable to use a train of short optical pulses instead for optical sampling of the signal. Such pulses must typically have a frequency of greater than about 1 GHz, and must exhibit extremely low timing jitter in order to sample without introducing noise. Modelocked fiber lasers have been employed for this purpose, but their use is confined primarily to the laboratory, due to their bulky nature and lack of stability. Therefore, for deployment outside of the laboratory, compact and stable sources of the type provided by the present invention are required.

The devices and methodologies of the present invention also have applications in optical communications. In accordance with the present invention, background noise suppression in excess of 12 dB is possible, even using less than optimal sinusoidal modulation and linear dispersion.

The devices and methodologies of the present invention also have applications in nonlinear optics applications, such as terahertz generation and the seeding of other pulsed lasers. Such applications stand to benefit particularly from the low repetition rate and high pulse energy possible with the present invention The preceding description of the present invention is merely illustrative, and is not intended to be limiting. Therefore, the scope of the present invention should be construed solely by reference to the appended claims.

What is claimed is:

1. A method for producing a pulse train, comprising the steps of:
    providing a source of a constant amplitude, wavelength modulated optical signal;
    providing a dispersive element;
    matching a chirp of the dispersive element with a cycle of the constant amplitude, wavelength modulated signal; and
    directing the constant amplitude, wavelength modulated signal into the dispersive element;
    wherein the source is a wavelength modulated laser, and wherein the dispersive element is a long fiber Bragg grating.

2. The method of claim 1, wherein the source is a single longitudinal mode source.

3. The method of claim 1, wherein the source comprises a laser having a reflective element, and wherein the signal is wavelength modulated by applying a current across the reflective element.

4. The method of claim 3, wherein the current modulates the center wavelength of the reflective element by way of carrier induced index changes.

5. The method of claim 1,
    wherein a frequency of the wavelength modulated signal is about 100 MHz or less.

6. The method of claim 1, wherein said matching further comprises matching a high order dispersion component of the dispersive element with residual nonlinear chirp.

7. The method of claim 1, wherein the source comprises a non-mode-locked wavelength modulated laser.

8. A method for generating a pulse train, comprising the steps of:
    providing a continuous wave (CW), frequency modulated (FM) signal; and
    impinging the CW FM signal on a dispersive element, said dispersive element being adapted to compress the signal in time, wherein an output signal from the dispersive element comprises a pulse train.

9. The method of claim 8, wherein the dispersive element comprises a fiber Bragg grating.

10. The method of claim 8, wherein the dispersive element is a single mode fiber.

11. The method of claim 10, wherein the fiber has a length of at least about 40 km.

12. The method of claim 8, wherein the CW FM signal is generated by a laser having a reflective element, and wherein the signal is frequency modulated by applying a current across the mirror.

13. The method of claim 12, wherein the current modulates the center wavelength of the reflective element by way of carrier induced index changes.

* * * * *

UNITED STATES PATENT AND TRADEMARK OFFICE
CERTIFICATE OF CORRECTION

PATENT NO.   : 6,834,134 B2
DATED        : December 21, 2004
INVENTOR(S)  : Brennan, III James F.

It is certified that error appears in the above-identified patent and that said Letters Patent is hereby corrected as shown below:

Title page,
Item [56], References Cited, OTHER PUBLICATIONS,
"Kjebon, et al." reference, delete "1.55 um" and insert -- 1.55 $\mu$m -- therefor.
"S.R. Chinn, et al." reference, delete "Laser$^{a,)}$" and insert -- Laser$^{a)}$ -- therefor.
"Eva Peral et al." reference, delete "Dispersion" and insert -- Dispersive -- therefor.

Column 3,
Line 66, delete "minor" and insert -- mirror -- therefor.

Signed and Sealed this

Eleventh Day of October, 2005

JON W. DUDAS
*Director of the United States Patent and Trademark Office*